(12) United States Patent
Jeong et al.

(10) Patent No.: US 8,021,966 B2
(45) Date of Patent: Sep. 20, 2011

(54) METHOD FABRICATING NONVOLATILE MEMORY DEVICE

(75) Inventors: Ji-Hyun Jeong, Seoul (KR); Jae-Hee Oh, Seongnam-si (KR); Jae-Hyun Park, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/644,224

(22) Filed: Dec. 22, 2009

(65) Prior Publication Data

US 2010/0159675 A1 Jun. 24, 2010

(30) Foreign Application Priority Data

Dec. 24, 2008 (KR) .................. 10-2008-0133609

(51) Int. Cl.
*H01L 21/00* (2006.01)

(52) U.S. Cl. ........... 438/482; 438/102; 438/95; 257/314

(58) Field of Classification Search .................. None
See application file for complete search history.

(56) References Cited

U.S. PATENT DOCUMENTS

| | | | | |
|---|---|---|---|---|
| 2006/0284237 A1* | 12/2006 | Park et al. | ...... | 257/314 |
| 2007/0048674 A1* | 3/2007 | Wells | ...... | 430/313 |
| 2008/0113469 A1* | 5/2008 | Eun et al. | ...... | 438/102 |
| 2008/0153302 A1 | 6/2008 | Peters | | |
| 2008/0280390 A1* | 11/2008 | Kim et al. | ...... | 438/95 |

FOREIGN PATENT DOCUMENTS

| KR | 1020060133394 A | 12/2006 |
|---|---|---|
| KR | 1020080078972 A | 8/2008 |

* cited by examiner

*Primary Examiner* — Ha Tran T Nguyen
*Assistant Examiner* — Shantanu C Pathak
(74) *Attorney, Agent, or Firm* — Volentine & Whitt, PLLC

(57) ABSTRACT

A method of fabricating a nonvolatile memory device includes; forming a first sacrificial layer pattern including a first open area that extends in a first direction on a lower dielectric layer, forming a pre-lower dielectric layer pattern including a recess that extends in the first direction using the first sacrificial layer pattern, forming a second sacrificial layer pattern including a second open area that extends in a second direction on the pre-lower dielectric layer pattern and the first sacrificial layer pattern, wherein the second open area intersects the first open area, forming a lower dielectric layer pattern including contact holes spaced apart in the recess using the first sacrificial layer pattern and second sacrificial layer pattern, wherein the contact holes extend to a bottom of the lower dielectric layer pattern, and forming a bottom electrode in the contact hole.

9 Claims, 16 Drawing Sheets

FIG. 1

| 10_1 | 10_2 | 10_3 | 10_4 | 10_5 | 10_6 | 10_7 | 10_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(20_1) | | SA/WD(20_2) | | SA/WD(20_3) | | SA/WD(20_4) | |
| PERIPHERY(30) | | | | | | | |
| SA/WD(20_8) | | SA/WD(20_7) | | SA/WD(20_6) | | SA/WD(20_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 10_16 | 10_15 | 10_14 | 10_13 | 10_12 | 10_11 | 10_10 | 10_9 |

METHOD FABRICATING NONVOLATILE MEMORY DEVICE

CROSS REFERENCE TO RELATED APPLICATION

This application claims priority from Korean Patent Application No. 10-2008-0133609 filed on Dec. 24, 2008, the subject matter of which is hereby incorporated by reference.

BACKGROUND

The inventive concept relates to a fabrication method for nonvolatile memory devices. More particularly, the inventive concept relates to a method of fabricating nonvolatile memory devices having a variable resistance material.

Nonvolatile memory devices using resistance materials include Phase Change Random Access Memory (PRAM), Resistive RAM (RRAM), and Magnetic RAM (MRAM). Unlike Dynamic RAM (DRAM) that stores data as charge placed on a capacitor, flash memory devices use various materials having changeable properties to store data. For example, PRAM uses a phase-changeable material such as a chalcogenide alloy, RRAM uses a variable resistance material, and MRAM uses Magnetic Tunnel Junction (MJT) thin films having a variable magnetization state.

As one example of a nonvolatile memory device using a variable resistance material, the PRAM will be described in some additional detail. The phase-change material used in conventional PRAMs has a crystalline state exhibiting low resistance and an amorphous state exhibiting high resistance. The crystalline state is commonly assigned a corresponding data value of 0, and the amorphous state is assigned a data state of 1.

The conventional PRAM is programmed (set or reset—assuming a binary memory cell) with a write pulse (e.g., a set pulse or a reset pulse). The write pulse applied to the phase-change material during a write operation uses a joule heating effect to define the desired data state (i.e., the crystalline or amorphous data state). When writing a data value of 1, the PRAM uses the reset pulse to heat the phase-change material above the melting temperature and then allows rapid cooling to define the amorphous state. When writing a data value of 0, the PRAM uses the set pulse to heat the phase-change material above the crystallization temperature and below the melting temperature and then maintains the heating temperature for a predetermined time to define the crystalline state.

SUMMARY

Embodiments of the inventive concept provide a method of fabricating a nonvolatile memory device exhibiting relatively low power consumption and reliable data access operations.

According to an aspect of the inventive concept, there is provided a method of fabricating a nonvolatile memory device, the method comprising; forming a first sacrificial layer pattern including a first open area that extends in a first direction on a lower dielectric layer, forming a pre-lower dielectric layer pattern including a recess that extends in the first direction using the first sacrificial layer pattern, forming a second sacrificial layer pattern including a second open area that extends in a second direction on the pre-lower dielectric layer pattern and the first sacrificial layer pattern, wherein the second open area intersects the first open area, forming a lower dielectric layer pattern including contact holes spaced apart in the recess using the first sacrificial layer pattern and second sacrificial layer pattern, wherein the contact holes extends to a bottom of the lower dielectric layer pattern, and forming a bottom electrode in the contact hole.

BRIEF DESCRIPTION OF THE DRAWINGS

The above and other features and advantages of the inventive concept will become apparent by describing in detail exemplary embodiments thereof with reference to the attached drawings in which:

FIG. 1 is a block diagram illustrating a nonvolatile memory device according to embodiment of the inventive concept;

DETAILED DESCRIPTION OF THE EMBODIMENTS

Figure 2:
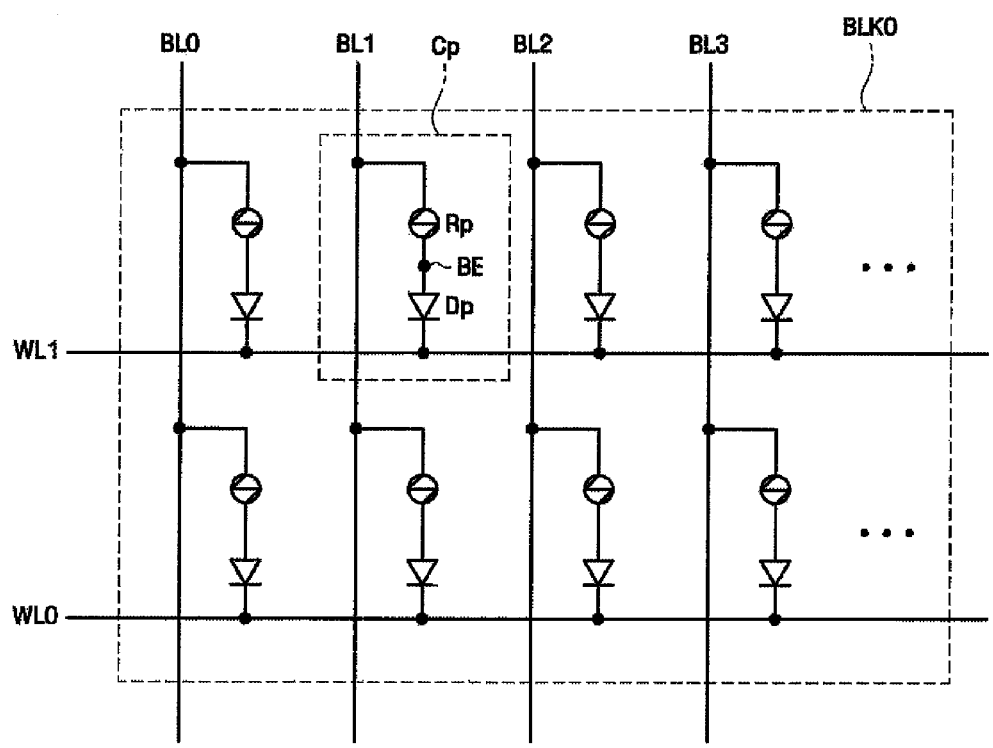
FIG. 2 is a circuit diagram illustrating a nonvolatile memory device according to embodiment of the inventive concept.

Advantages and features of the inventive concept and methods of accomplishing the same may be understood more readily by reference to the following detailed description of preferred embodiments and the accompanying drawings. The inventive concept may, however, be embodied in many different forms and should not be construed as being limited to only the illustrated embodiments. Rather, the embodiments are presented as teaching examples. In the drawings, the size and relative sizes of various layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, and/or sections, these elements, components, and/or sections should not be limited by these terms. These terms are only used to distinguish one element, component or section from another element, component, or section. Thus, a first element, component, or section discussed below could be termed a second element, component, or section without departing from the teachings of the inventive concept.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. Throughout the written description and drawings, like reference numbers and labels refer to like or similar elements.

Exemplary embodiments of the inventive concept are described herein with reference to cross-section illustrations that are schematic illustrations of idealized exemplary embodiments (and intermediate structures) of the inventive concept. As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Hereinafter, although exemplary embodiments of the inventive concept will be described as using a phase change random access memory PRAM, it will be understood by those skilled in this art that the inventive concept can be applied to all kinds of nonvolatile memory devices using a resistance material such as RRAM and MRAM.

FIG. 1 is a block diagram and FIG. 2 is a corresponding circuit diagram illustrating a nonvolatile memory device according to an embodiment of the inventive concept. A nonvolatile memory device having sixteen (16) memory banks is used as an example, but other configurations are contemplated by the inventive concept. Further, for the sake of brevity, the circuit diagram of FIG. 2 is drawn to only the first memory block BLK0 of FIG. 1.

First, referring to FIG. 1, a nonvolatile memory device according to an embodiment of the inventive concept comprises multiple memory banks 10_1 -10_16, multiple sense amplifiers and write drivers 20_1-20_8, and peripheral circuit region 30.

Each of the multiple memory banks 10_1-10_16 may further comprise multiple memory blocks BLK0-BLK7, and each memory block BLK0-BLK7 comprises multiple memory cells arranged in a matrix of rows and columns. In the illustrated embodiments, an arrangement of 8 memory blocks is assumed as an example.

Also, although not shown in the drawings, the nonvolatile memory device may additionally comprise a column decoder and a row decoder corresponding to the memory bank 10_1-10_16, and may be used to select the column and row of a nonvolatile memory cell having data written thereto or read therefrom.

The sense amplifier and the write driver 20_1-20_8 that correspond to the two memory banks 10_1-10_16 are also provided and perform read and write operations on the memory banks. In the illustrated embodiment of the inventive concept, although the sense amplifier and the write driver 20_1-20_8 are shown in relation to two memory banks 10_1-10_16, the scope of the inventive concept is not limited thereto. Thus, the sense amplifier and the write driver 20_1-20_8 that correspond to one memory bank or four memory banks may be used.

In the peripheral circuit region 30, multiple logic circuit blocks and a voltage generator that drive the column decoder, the row decoder, and the sense amplifier and the write driver may be provided.

Referring to FIG. 2, in the memory block BLK0 of the nonvolatile memory device, multiple memory cells Cp, multiple bit lines BL0-BL3, and multiple word lines WL0 and WL1 are provided.

The multiple memory cells Cp are disposed in an area where the word lines WL0 and WL1 and the bit lines BL0-BL3 intersect. The memory cell Cp may have a crystalline state or an amorphous state depending on applied current. That is, the memory cell Cp includes a variable resistive element Rp exhibiting a different resistance value for each state, and a vertical cell diode Dp connected to the variable resistive element Rp via a bottom electrode BE. The vertical cell diode Dp controls the current applied to the variable resistive element Rp. Here, the variable resistive element Rp may be composed of various phase-change materials, such as two atomic compounds including as examples GaSb, InSb, InSe, $Sb_2Te_8$, or GeTe, three atomic compounds such as GeSbTe, GaSeTe, InSbTe, $SnSb_2Te_4$, or InSbGe, or four atomic compounds such as AgInSbTe, (GeSn)SbTe, GeSb(SeTe), or $Te_{51}Ge_{15}Sb_2S_2$. For example, the variable resistive element Rp may include GeSbTe which consists of germanium Ge, antimony Sb, and tellurium Te. In the drawing, although it is illustrated that the variable resistive element Rp is coupled with the bit lines BL0-BL3 and the vertical cell diode Dp is coupled with the word lines WL0 and WL1, it can be illustrated that the variable resistive element Rp is coupled with the word lines WL0 and WL1 and the vertical cell diode Dp is coupled with the bit lines BL0-BL3.

Hereinafter, referring to FIG. 2, the operation of the illustrated nonvolatile memory device will be described in some additional detail.

First, a write operation for the nonvolatile memory device will be described. By heating the variable resistive element Rp above the melting temperature Tm followed by fast cooling, Rp can be placed in an amorphous state assigned a (set) data value of 1. Also, by heating the variable resistive element Rp above the crystallization temperature Tx and under the melting temperature Tm and maintaining the heating temperature for predetermined time followed by cooling, Rp can be placed in a crystalline state assigned a (reset) data value of 0. Here, to change phase of the variable resistive element Rp, significantly high level of write current penetrates the variable resistive element Rp. For example, a write current of about 1 mA is used for reset and a write current of about 0.6 mA-about 0.7 mA is used for set. Such write current is generated by a write circuit (not shown) and flows through the bit lines BL0-BL3, the vertical cell diode Dp, and ground voltage.

A read operation for the nonvolatile memory device can be accomplished by reading data stored by providing the variable resistive element Rp with read current whose level does not allow the variable resistive element Rp to be phase-changed. Such read current is generated by a read circuit (not shown) and flows through the bit line BL0-BL3, the vertical cell diode Dp, and ground voltage.

Figure 3:
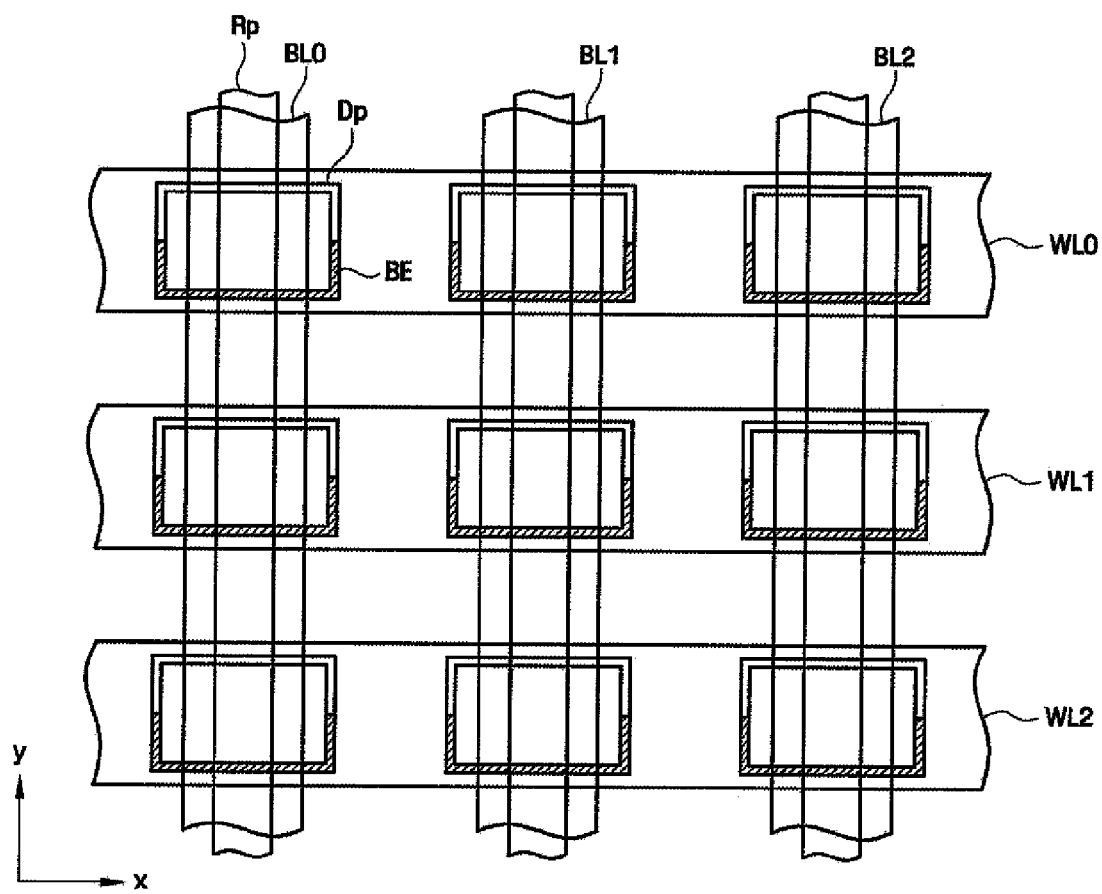
FIG. 3 is a layout diagram illustrating a nonvolatile memory device according an embodiment of the inventive concept.

Referring to FIG. 3 and FIGS. 4A through 4L, a method of fabricating a nonvolatile memory device according to an embodiment of the inventive concept will be described. FIG. 3 is a layout illustrating a nonvolatile memory device according an embodiment of the inventive concept. FIGS. 4A through 4L are related perspective views illustrating a method of fabricating the nonvolatile memory device.

Hereinafter, for ease and clarity of description, a "first direction" is defined as the y-axis direction shown in the drawings, a "second direction" is the x-axis direction, and a "third direction" is the z-axis direction.

Figure 4A:
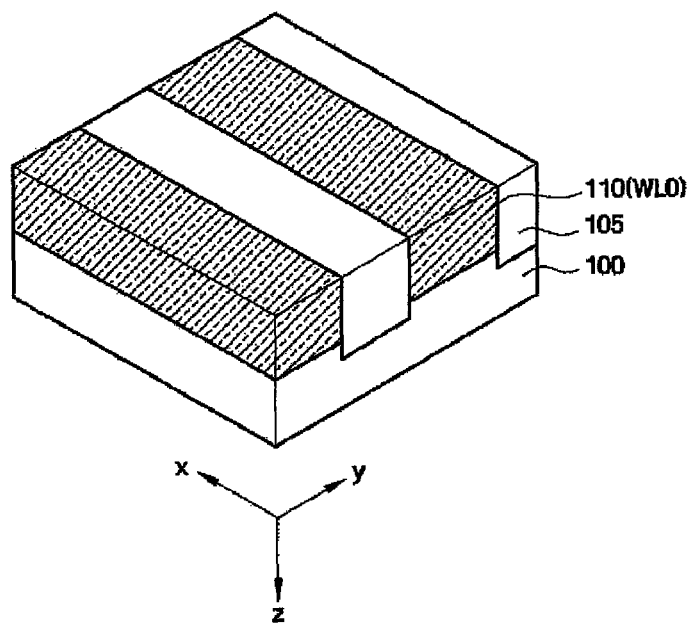
FIGS. 4A through 4L are related perspective views illustrating a method of fabricating a nonvolatile memory device according to an embodiment of the inventive concept.

First, referring to FIGS. 3 and 4A, in a first conductive type (e.g., a P-type) substrate 100 multiple active regions are defined by forming a device isolation region 105. The multiple active regions in the illustrated embodiment extend along the second direction in parallel with each other. In these active regions, a word line 110 is formed by implanting impurities of a second conductive type (e.g., N-type). A silicon substrate, a Silicon On Insulator (SOI) substrate, a GaAs substrate, or a silicon germanium substrate may be used as the substrate 100.

Here, although it is illustrated that the word line 110 is formed by impurity implantation of the second conductive type, it is not limited thereto. For example, the word line 110 may be formed by epitaxial growth. In a specific example, on the substrate mold layer patterns including multiple open areas to expose predetermined areas of the substrate 100 are formed. Next, by using selective epitaxial growth; SEG method or solid phase epitaxial; SPE, an epitaxial layer is formed in the open areas. On the entire surface of substrate 100 where the epitaxial layer is formed the multiple word lines 110 are completed by performing impurity implantation of the second conductive type. When impurity is doped in situ during the selective epitaxial growth or the solid phase epitaxial growth, ion implantation process can be skipped.

Figure 4B:
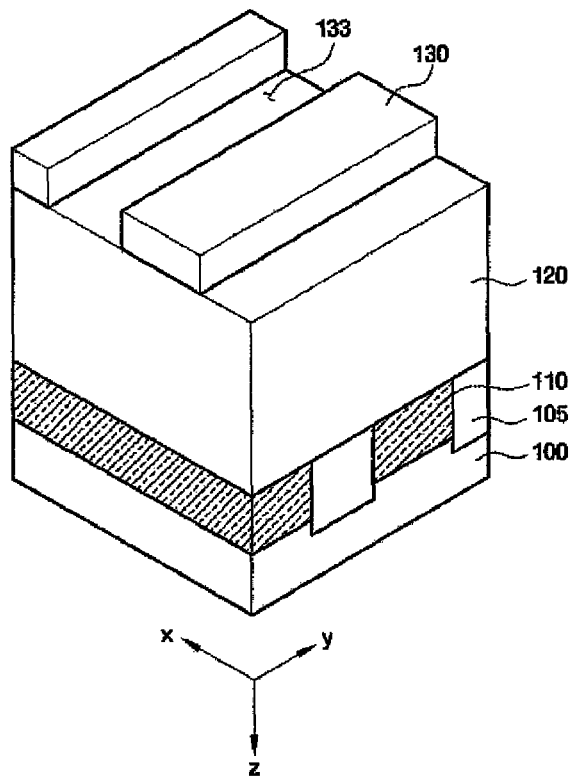

Referring to FIGS. 3 and 4B, a lower dielectric layer 120 and a first sacrificial layer pattern 130 are formed on the substrate 100. Specifically, the lower dielectric layer 120 and a first sacrificial layer are sequentially formed on the substrate 100, and the first sacrificial pattern 130 is formed by patterning the first sacrificial layer. Here, the first sacrificial layer pattern 130 includes a first open area 133 extending in the first direction and may be composed of materials having etching selectivity to the lower dielectric layer 120.

Figure 4C:
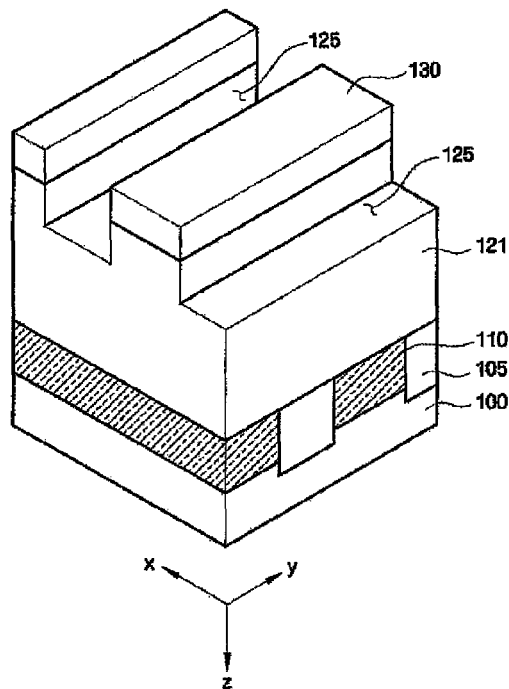

Referring to FIGS. 3 and 4C, by using the first sacrificial layer pattern 130, a pre-lower dielectric layer pattern 121 including a recess 125 extending in the first direction is formed. Specifically, by using the first sacrificial layer pattern 130 formed on the lower dielectric layer 120 as etching mask, the lower dielectric layer 120 is partially etched to form the pre-lower dielectric layer pattern 121 including the recess 125.

Here, the step of forming the pre-lower dielectric layer pattern 121 and the step of forming the first sacrificial layer pattern 130 can be performed using different etching processes. However, it is not limited thereto and in another exemplary embodiment of the inventive concept the step of forming the pre-lower dielectric layer pattern 121 and the step of forming the first sacrificial layer pattern 130 are performed by using the same etching process. Thus, by patterning the first sacrificial layer formed on the lower dielectric layer 120 and the lower dielectric layer 120 simultaneously, the first sacrificial layer pattern 130 and the pre-lower dielectric layer pattern 121 can be formed.

Figure 4D:
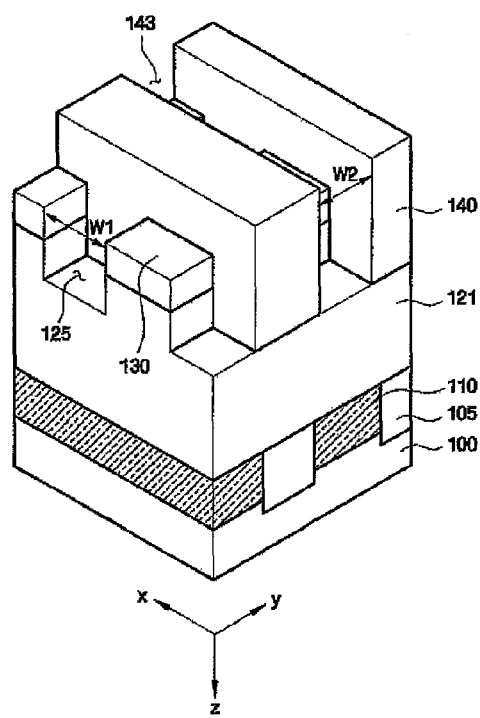

Referring to FIGS. 3 and 4D, on the pre-lower dielectric layer pattern 121 and the first sacrificial layer pattern 130 a second sacrificial layer pattern 140 including a second open area 143 extending in the second direction is formed. Specifically, on the pre-lower dielectric layer pattern 121 and the first sacrificial layer pattern 130 a second sacrificial layer is formed, and the second sacrificial layer is patterned to form the second sacrificial layer pattern 140. Here, the second open area 143 intersects the first open area 133 and the width W2 of second open area 143 is less than the width W1 of first open area 133.

The second sacrificial layer pattern 140 comprises material having etching selectivity to the first sacrificial layer pattern 130 and the pre-lower dielectric layer pattern 121. For example, the pre-lower dielectric layer pattern 121 may comprise silicon oxide SiO2, the first sacrificial layer pattern 130 may comprise a silicon oxynitride layer SiON, and the second sacrificial layer pattern 140 may comprise a silicon nitride layer SiN.

As a result, in the illustrated embodiment of the inventive concept, the first and second sacrificial layer patterns 130 and 140 formed on the pre-lower dielectric layer pattern 121 are line patterns extending in the second direction and the first direction, respectively.

Figure 4E:
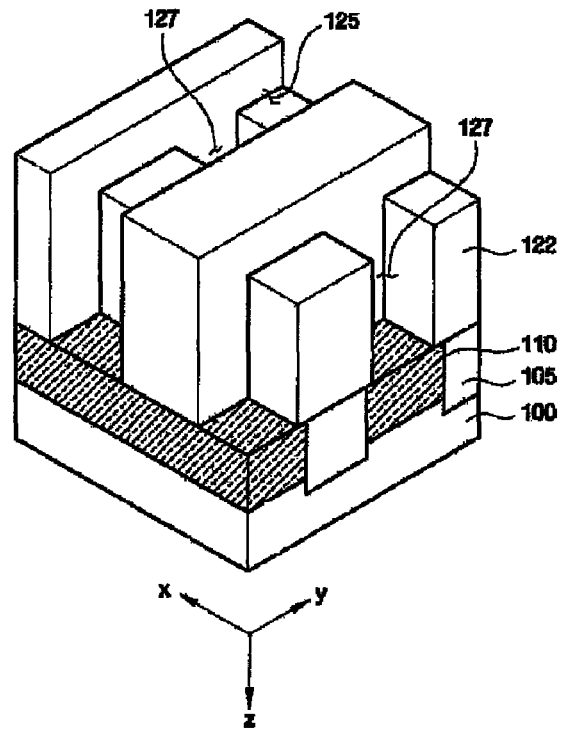

Referring to FIGS. 3 and 4E, using the first and the second sacrificial layer patterns 130 and 140, a lower dielectric layer pattern 122 including multiple spaced apart contact holes 127 is formed in the recess 125.

Here, each contact hole 127 extends in the third direction from a lower side of recess 125 to a lower side of pre-lower dielectric layer pattern 121 to expose the lower word line 110. Also, the contact hole 127 is defined as an area where the first and the second open area 133 and 143 intersect in a rectangular shape. Specifically, the contact hole 127 may have a rectangular shape defined by its width that extends in the second direction and is greater than its length that extends in the first direction y.

Forming the lower dielectric layer pattern 122 may include using the first and second sacrificial layer pattern 130 and 140 as an etch mask to etch the pre-lower dielectric layer 121, to remove portions of the first and the second sacrificial layer pattern 130 and 140. In contact hole 127, the bottom electrode may be formed, and in the recess 125 a variable resistor pattern which is self-aligned with the bottom electrode may be formed. The following section describes in some additional detail this relationship in the context of FIGS. 4G through 4L.

Forming the contact hole 127 using the first and second sacrificial layer patterns 130 and 140 has an advantage over forming the contact hole 127 by using one sacrificial layer pattern (e.g., a photoresist pattern) which defines the contact hole 127 with respect to a defined size scaling for the contact hole 127.

Specifically, if a sacrificial layer pattern including a rectangularly shaped open area array is not used to form a rectangular contact hole dielectric layer using a photolithography process, it is difficult to control the width and length of the open area due to limitations of the photolithography process (e.g., inherent limitations within conventional photolithography equipment). Also, the open area formed in such a manner may end up with an oval or circular shape having a large curvature due to the large rounded edges, instead of the desired rectangular shape. Thus, when the contact hole 127 is formed by etching the lower dielectric layer using the array-shaped sacrificial layer pattern formed in such a manner, it is difficult to control the width and length of the formed contact hole 127 to avoid having an oval or circular shape. Specifically, this phenomenon is more likely as the size scaling of the contact hole 127 is reduced to provide more densely integrated nonvolatile memory devices.

However, within various embodiments of the inventive concept, since the first and second sacrificial layer patterns 130 and 140 have a linear shape that is relatively easy to control, the width of each pattern and pitch between patterns is better defined when compared with analogous photolithography processes. This improved edge geometry control provides an improved contact hole 127 as formed by using the first and second sacrificial layer patterns. Also, although the contact hole 127 formed by this approach may include slightly rounded corners, the great majority of the sides of the contact hole 127 nonetheless remain very linear rather than being curved. Thus, the contact hole 127 provided by embodiments of the inventive concept is substantially rectangular in shape.

Also, although not illustrated in the drawings, in another embodiment of the inventive concept, an etch stop layer comprising a material having etching selectivity to the lower dielectric layer 120 may be provided between the substrate 100 and the lower dielectric layer 120.

Figure 4F:
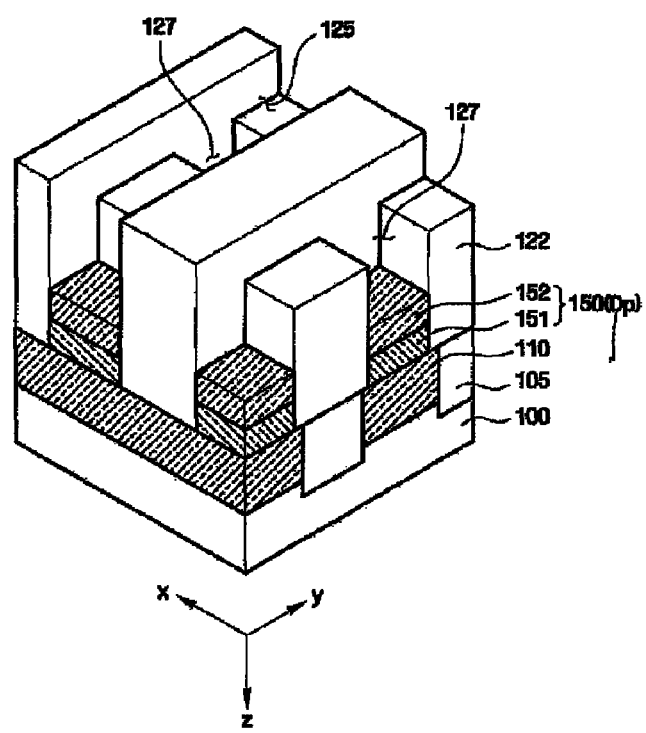

Referring to FIGS. 3 and 4F, in the contact hole 127 a vertical cell diode 150 is formed by forming first and second semiconductor patterns 151 and 152.

The first and second semiconductor patterns 151 and 152 may be formed by using various conventionally understood methods. For example, the first and second semiconductor patterns 151 and 152 may be grown by using epitaxial growth method. In this case, the first semiconductor pattern 151 can be grown by using the word line 110 exposed by the contact hole 127 as a seed layer, and the second semiconductor pattern 152 can be grown by using the first semiconductor layer 151 as a seed layer. Here, if the word line 110 is single crystal in nature, the first and second semiconductor layers 151 and 152 will also be single crystal. Alternately, the first and second semiconductor patterns 151 and 152 may be formed using solid phase epitaxial or SPE method.

Next, ion implantation of second conductive type (e.g., N-type) impurities is performed on the first semiconductor pattern 151, and ion implantation of first conductive type (e.g., P-type) impurities is performed on the second semiconductor pattern 152. However, when impurities are doped in situ during the selective epitaxial growth process or the solid phase epitaxial process, ion implantation process step need not be performed.

In certain embodiments of the inventive concept, the first semiconductor pattern 151 will have a lower impurity concentration than that of the word line 110, and the second semiconductor pattern 152 will have a higher impurity concentration than that of the first semiconductor pattern 151. When reverse bias is applied to the vertical cell diode 150, the vertical cell diode 150 reduces leakage current that flows through the reverse biased vertical cell diode. The reverse bias can be applied to the vertical cell diode 150 of non-selected phase change memory cells during write or read.

Figure 4G:
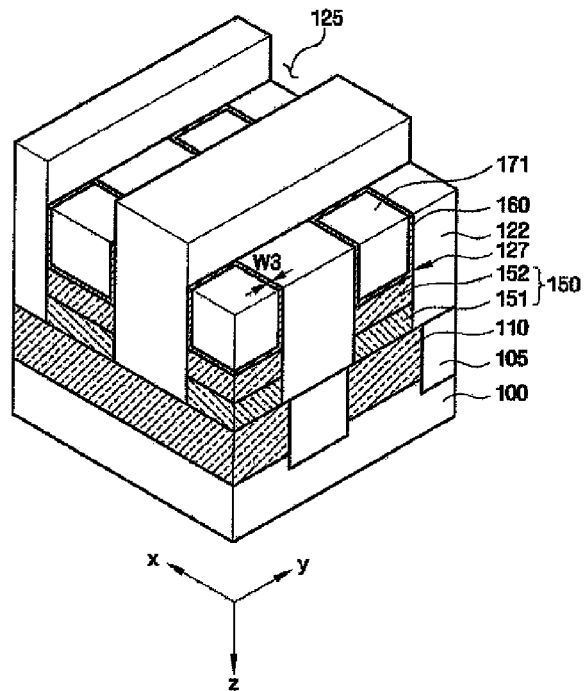

Referring to FIGS. 3 and 4G, a conductive layer 160 which is conformally formed on the vertical cell diode 150 and sidewalls of the contact hole 127 is formed and a first inner dielectric layer 171 is formed on the conductive layer 160 to fill the contact hole 127. And, to expose the top of the second lower dielectric layer pattern 122, the structure illustrated in FIG. 4G is formed using a planarization process such as etch back.

Here, since the width W3 of the conductive layer 160 determines the contact area between the bottom electrode which is described later and the variable resistor pattern, the conductive layer 160 can be formed using methods capable of accurately defining the width W3. For example, the conductive layer 160 may be formed by using methods including Atomic Layer Deposition (ALD), Metal Organic Chemical Vapor Deposition (MO CVD), thermal CVD, biased CVD, plasma CVD, and Electro Magnetic Resonance CVD (ECR CVD).

The conductive layer 160 may include at least one material selected from a group of materials including; titanium nitride (TiN), titanium aluminum nitride (TiAlN), tantalum nitride (TaN), tungsten nitride (WN), molybdenum nitride (MoN), niobium nitride (NbN), titanium silicon nitride (TiSiN), titanium boronitride (TiBN), zirconium silicon nitride (ZrSiN), tungsten silicon nitride (WSiN), tungsten boronitride (WBN), zirconium aluminum nitride (ZrAlN), molybdenum aluminum nitride (MoAlN), tantalum silicon nitride (TaSiN), tantalum aluminum nitride (TaAlN), titanium tungsten (TiW), titanium aluminum (TiAl), titanium Oxynitride (TiON), titanium aluminum oxynitride (TiAlON), tungsten Oxynitride (WON), tantalum oxynitride (TaON).

In one embodiment of the inventive concept, the first inner dielectric layer 171 is formed from a silicon oxide layer, a silicon oxynitride layer, and/or a silicon nitride layer.

In another exemplary embodiment of the inventive concept a metal silicide layer may be formed on the vertical cell diode 150 to serve as an ohmic layer of the vertical cell diode 150. Specifically, on the vertical cell diode 150 a metal layer including at least one of Co, Ni, and Ti may be formed followed by a heat treatment of the metal layer to form a metal silicide layer.

Figure 4H:
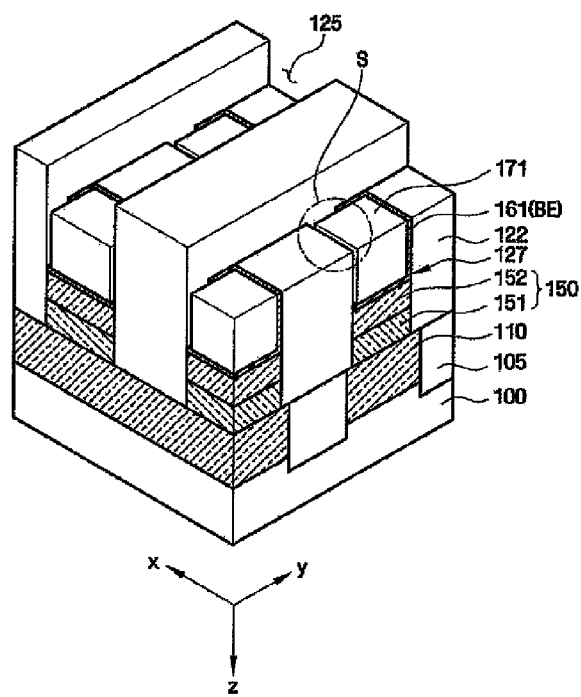
Figure 4I:
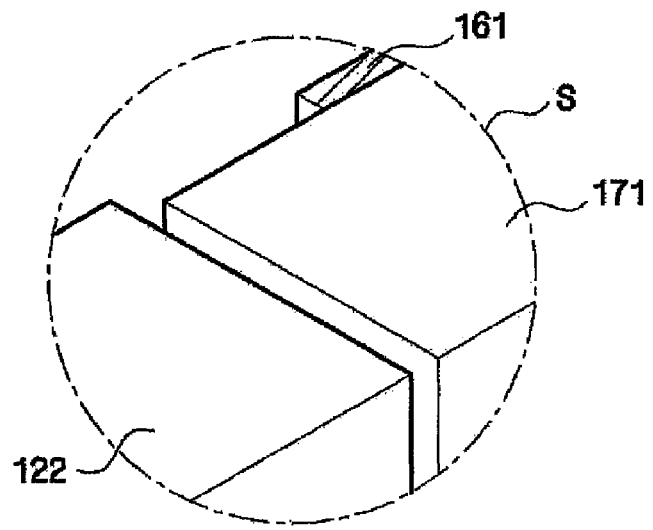

Referring to FIGS. 3, 4H, and 4I, a portion of the conductive layer 160 formed on the sidewall of the contact hole 127 is etched to form a bottom electrode 161. Here, FIG. 4I is a diagram which enlarges the "S" section identified in FIG. 4H.

Specifically, on the lower dielectric layer pattern 121 etch stop layer is formed, and then a third sacrificial layer pattern (not shown) is formed. Next, the conductive layer 160 formed on the partial sidewall of the etch stop layer and the contact hole 127 exposed by the third sacrificial layer pattern is etched to form the bottom electrode 161 and the third sacrificial layer pattern is removed. Here, the etch stop layer not only indicates etch stop point during the third sacrificial layer formation, but also protects an unetched conductive layer in the following process. Such an etch stop layer, for example, may be composed of metal oxide material such as hafnium oxide (HfOx), but this layer is not used in certain embodiments of the inventive concept.

Etching of the conductive layer 160 comprises (assuming that the contact hole 127 includes a first and a second side walls facing each other and a third and a fourth side walls adjacent to the first side wall and facing each other) etching the conductive layer 160 formed on the first side wall and part of the third and fourth side walls which are adjacent to the first side wall from the top of the contact hole 127. Etching the conductive layer 160 also comprises using an etch process having etch selectivity to the first inner dielectric layer 171 and the lower dielectric layer pattern 121.

Figure 5A:
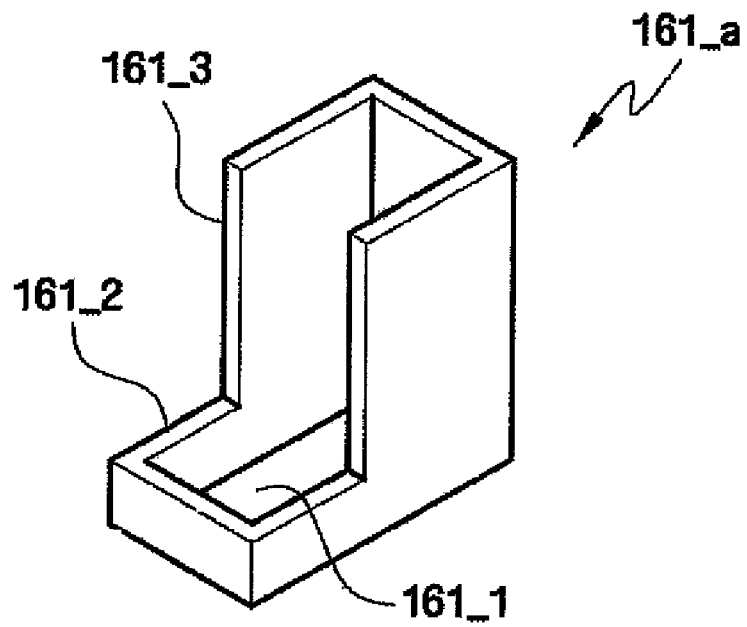
FIGS. 5A and 5B are perspective views further illustrating a bottom electrode formed by the method of fabricating the nonvolatile memory device according to an embodiment of the inventive concept.
Figure 5B:
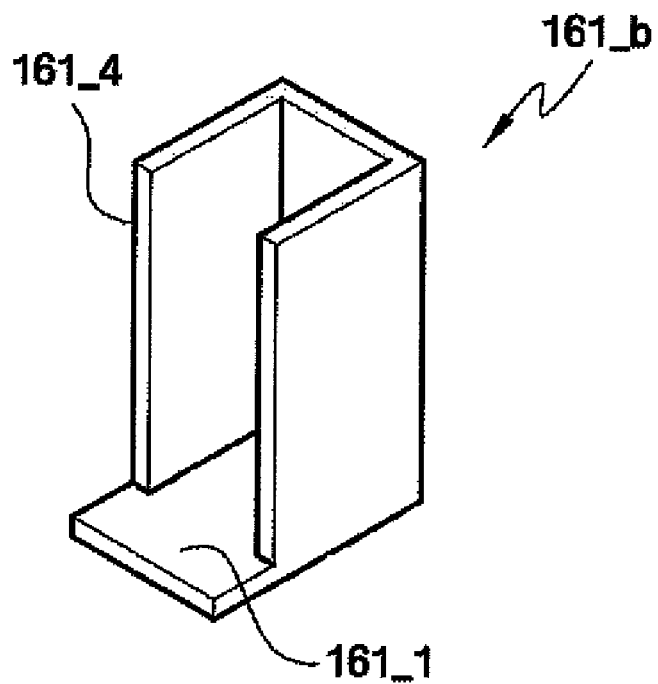

The structure of the bottom electrode 161 formed in this manner, (i.e., a bottom electrode 161 having a shape illustrated in FIG. 5A or 5B).

A bottom electrode 161_A shown in FIG. 5A may include a bottom part 161_a and a first sidewall part 161_2 and a second sidewall part 161_3 formed along the edge of the bottom part 161_a and having different heights. Here, the first sidewall part 161_2 is formed by partially etching the conductive layer 160 formed on part of the contact hole 127 during the etch process in FIG. 4H, whereas the second sidewall part 161_3 can be formed as a result of protection from the etch process by the third sacrificial layer pattern.

Unlike the bottom electrode 161_a of FIG. 5A, a bottom electrode 161_b shown in FIG. 5B includes only a bottom part 161_1 and a sidewall part 161_4 formed along part of the edge of the bottom part 161_1. The bottom electrode 161_b of FIG. 5B can be formed by etching the conductive layer 160 formed on part of the contact hole 127 from the top of the contact hole 127 to the bottom part 161_1 of the bottom electrode 161.

Thus, a portion of the top of the bottom electrode 161 formed in FIG. 4H has the same level as the top of the contact hole 127 (or, the bottom side of the recess), whereas other portions of the top can be formed below the top of the contact hole 127.

Figure 4J:
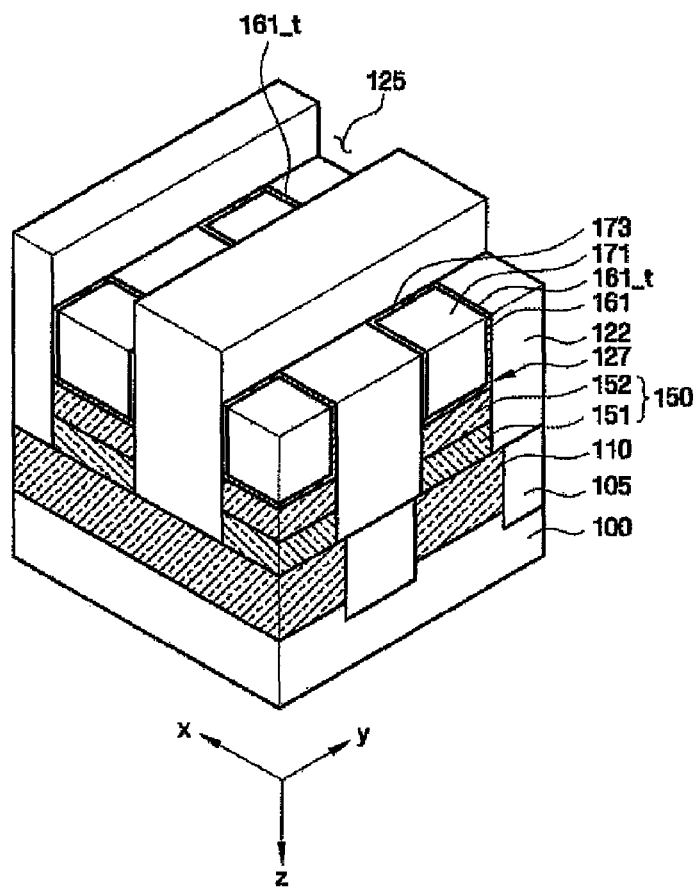

Referring to FIGS. 3 and 4J, a second inner dielectric layer 173 is formed on the bottom electrode 161 to fill the contact hole 127. To expose the top of the lower dielectric layer pattern 122 (specifically, the bottom side of the recess 125), the structure illustrated in FIG. 4J is formed using a planarization process such as etch back. Here, the second inner dielectric layer 173 similar to the first inner dielectric layer 171 may comprise a silicon oxide layer, a silicon oxynitride layer, or silicon nitride layer.

As a result, only a portion of the bottom electrode 161 is exposed from the first and second inner dielectric layers 171 and 173. Specifically, only the portion of the top 161_t having the same level as the bottom side of the recess 125 is exposed from the first and second inner dielectric layers 171 and 173.

Figure 4K:
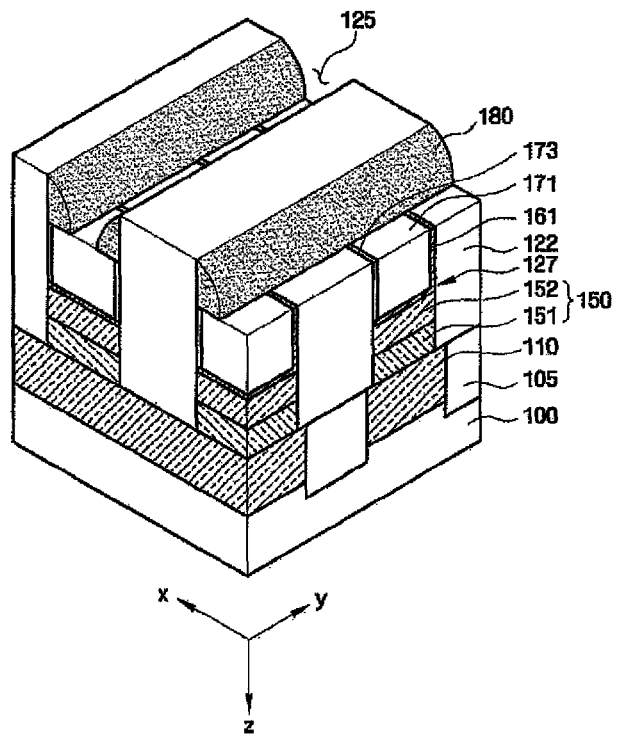

Referring to FIGS. 3 and 4K, a spacer 180 is formed on the bottom electrode 161 and on the sidewall of the recess 151. Specifically, a spacer dielectric layer can be formed on the bottom electrode 161, and by performing etch-back the dielectric layer the spacer 180 can be completed. The spacer 180 may be formed from a material having etching selectivity to the lower dielectric pattern 122. For example, if the lower dielectric pattern 122 is composed of silicon oxide layer, the spacer 180 may be composed of silicon oxynitride layer or silicon nitride layer.

Figure 4L:
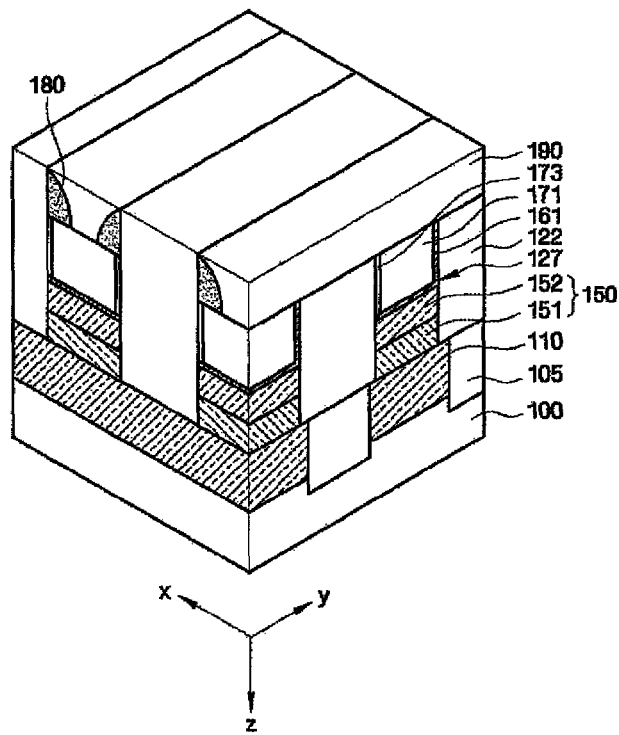

Referring to FIGS. 3 and 4L, 161 in the recess 125 of the second lower dielectric layer pattern 122 a variable resistor pattern 190 which is partially connected to the top of bottom electrode 161 is formed. Here, the variable resistive pattern 190 is composed of phase-change material and, for example, can be composed of various materials, such as two atomic compounds such as GaSb, InSb, InSe, $Sb_2Te_8$, or GeTe, three atomic compounds such as GeSbTe, GaSeTe, InSbTe, $SnSb_2Te_4$, or InSbGe, or four atomic compounds such as AgInSbTe, (GeSn)SbTe, GeSb(SeTe), or $Te_{51}Ge_{15}Sb_2S_2$.

The variable resistor pattern 190 is formed on the bottom electrode 161 and the spacer 180 in the recess 125 to be self-aligned with the bottom electrode 161. Thus, the variable resistor pattern 190 can be aligned with the bottom electrode 161 without miss-align which can be created due to various process conditions. Therefore, in the illustrated embodiment of the inventive concept a distribution of a contact area between the bottom electrode 161 and the variable resistor pattern 190 is decreased and resistance distribution of memory cells can also be decreased. As a result, the nonvolatile memory device formed according to the embodiment of the inventive concept can operate with higher reliability.

Also, the variable resistor pattern 190 contacts a portion of the top 161_t of bottom electrode 161 due to the spacer 180 formed on the bottom electrode 161. Thus, by controlling the width of the spacer 180 using an etch back process, the variable resistor pattern 190 may contact a portion of the top 161_t of the bottom electrode 161.

Figure 6A:
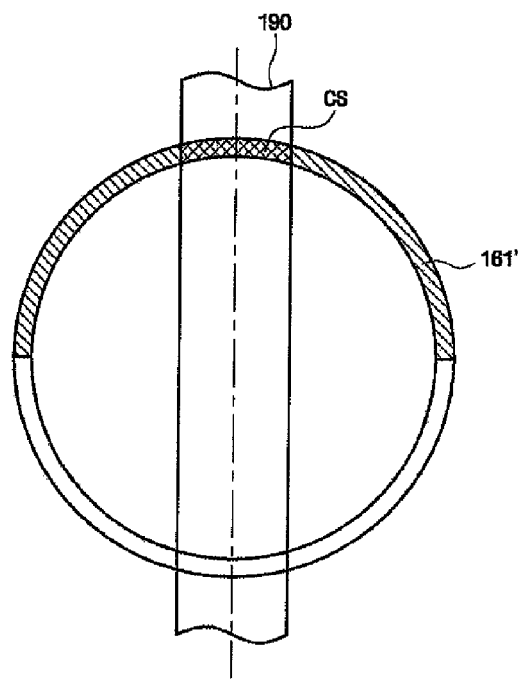
FIGS. 6A and 6B are diagrams further illustrating a contact area between the bottom electrode and variable resistance pattern that depends on the shape of an associated contact hole.
Figure 6B:
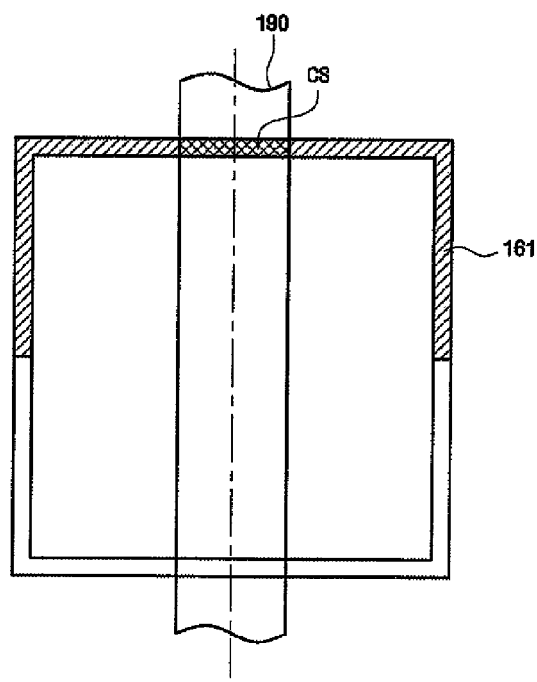

Also, as previously described, unlike the conventionally formed contact hole (e.g., a circular or oval shaped contact hole), the array-shaped sacrificial layer pattern the contact hole 127 formed by using the first and second sacrificial layer patterns 130 and 140, which are linear in shape, has a substantially rectangular shape. As a result, the contact area between the part of the bottom electrode 161 formed on one side of the contact hole 127 and the variable resistor pattern 190 has a substantially linear shape. However, since there is no curvature effect in the contact area between the bottom electrode 161 and the variable resistor pattern 190, as illustrated in FIGS. 6A and 6B, the contact area CS between the bottom electrode 161 and the variable resistor pattern 190 may be relatively small as compared with the conventional case where the contact area between the bottom electrode 161' and the variable resistor pattern 190 is in curved shape. Thus, the contact area between the bottom electrode 161 and the variable resistor pattern 190 may be reduced in size and power consumption by the constituent nonvolatile memory device may be decreased accordingly.

Also, although in the drawing the variable resistor pattern 190 is illustrated as line shape, it is not limited thereto. For example, in another exemplary embodiment of the inventive concept a variable resistor pattern 190 can be an island shape and formed only near an area where a word line (for example, WL0) and a bit line (for example, BL0) intersect.

On the variable resistor pattern 190, a top electrode and a bit line may be formed in some embodiments of the inventive concept. Here, the top electrode can be composed of the same material that composes the bottom electrode. The bit line extends in the first direction, is formed on the top electrode, and can be crossed by the word line 110. Here, the bit line can be connected to the top electrode via a plug.

Figure 7A:
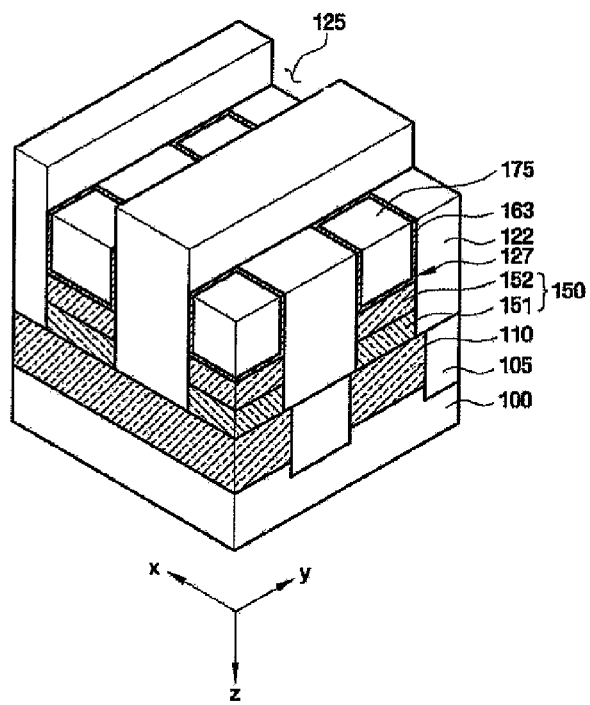
FIGS. 7A and 7B are perspective views illustrating a method of fabricating a nonvolatile memory device according to another embodiment of the inventive concept.
Figure 7B:
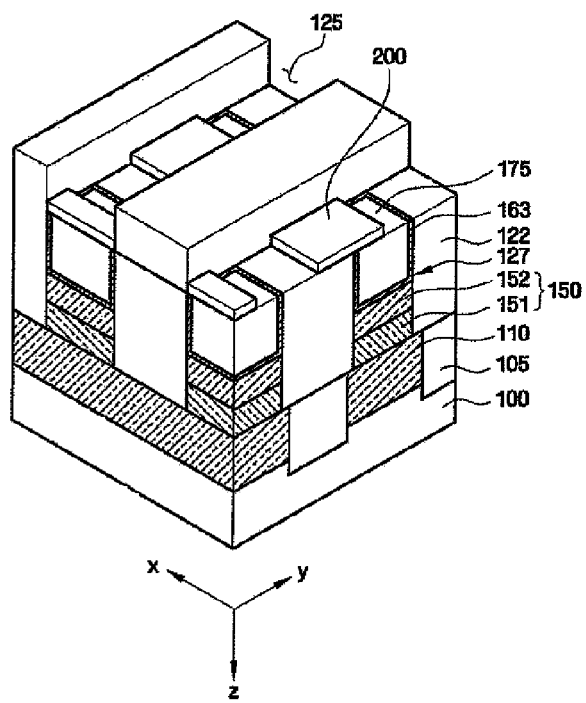

Referring to FIGS. 7A and 7B, a method of fabricating a nonvolatile memory device according to another embodiment of the inventive concept is described. FIGS. 7A and 7B are perspective views illustrating structures of process intermediate steps that describe the method of fabricating the nonvolatile memory device according to this exemplary embodiment of the inventive concept.

The method of fabricating a nonvolatile memory device illustrated in FIGS. 7A and 7B is substantially similar to the method of fabricating a nonvolatile memory device previously described, except that a bottom electrode 163 is formed without etching a conductive layer formed on a partial sidewall of a contact hole 127, and additionally an outer dielectric layer 200 is formed on a partial side of the bottom electrode 163.

Referring to FIG. 7A, a device isolation region 105 is formed in a first conductive (e.g., P-type) substrate 100 to define a multiple active region. For example, the multiple active regions extend in the second direction in parallel with each other. In such multiple active regions, second conductive (e.g., N-type) impurities are implanted to form a word line 110.

Next, a lower dielectric layer and a first sacrificial layer pattern including a first open area are formed on the substrate 100. Here, the first open area extends in the first direction. And by using the first sacrificial layer pattern a pre-lower dielectric layer pattern including a recess which extends in the first direction is formed.

Then, on the pre-lower dielectric layer pattern and the first sacrificial layer pattern a second sacrificial layer pattern including a second open area is formed. Here, the first open area and the second open area can intersect. And by using the first and the second sacrificial layer patterns, a lower dielectric layer pattern 122 including multiple contact holes 127 which are separately placed is formed in a recess 125.

Next, in the contact hole, a first semiconductor pattern 151 and second semiconductor pattern 152 are formed to form the vertical cell diode 150.

Next, a conductive layer is conformally formed on the vertical cell diode 150 and on the sidewall of the contact hole 127 and an inner dielectric layer 175 is formed to fill the contact hole 127. And, to expose the bottom of the recess 125 the bottom electrode 163 is formed by using a planarization process, such as etch back. The bottom electrode 163 formed by such method can include a bottom part and a sidewall side formed along the edge of the bottom part and only the top of the sidewall part can be exposed from the inner dielectric layer 175.

Referring to FIG. 7B, on the lower dielectric layer pattern 122 the outer dielectric layer 200 is formed to partially cover the top of the sidewall part of the bottom electrode 163. As a result, only part of the top of the bottom electrode 163 is exposed from the inner dielectric layer 175 and the outer dielectric layer 200.

In certain embodiments of the inventive concept, a spacer may be formed on the sidewall of the bottom electrode 163 and the recess 125, and then a variable resistor pattern is formed on the spacer. Next, a top electrode and a bit line are formed on the variable resistor pattern. Here, the bit line extends in the second direction, is formed on the top electrode, and can be crossed with a word line. Also, the bit line can be connected to the top electrode via a plug.

Figure 8A:
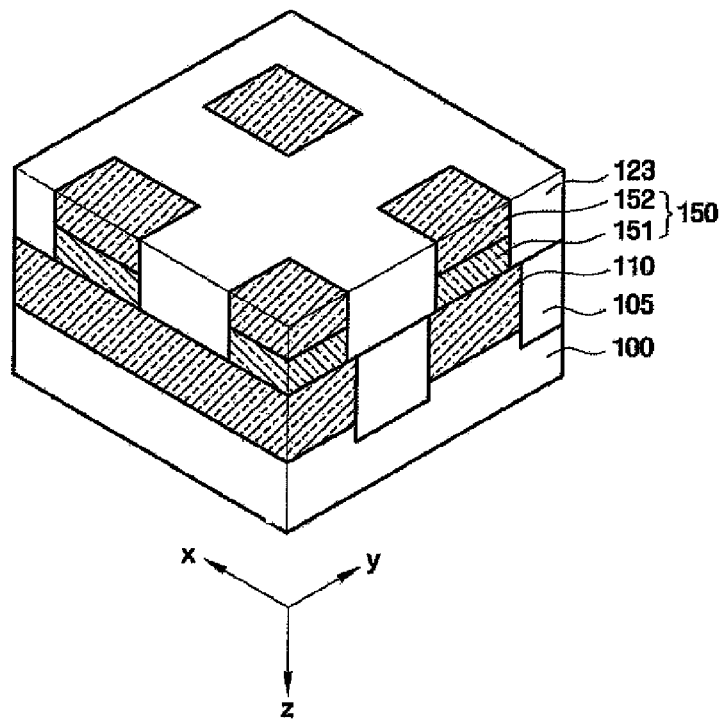
FIGS. 8A through 8E are perspective views illustrating a method of fabricating a nonvolatile memory device according to another embodiment of the inventive concept.
Figure 8B:
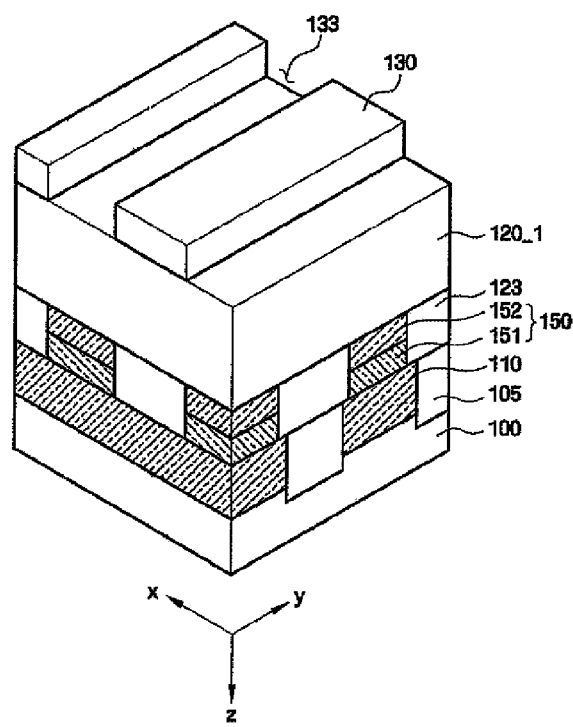
Figure 8C:
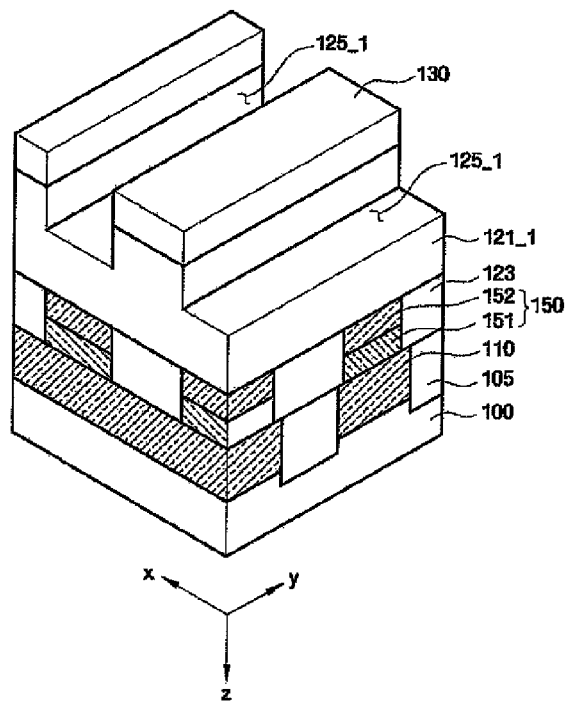
Figure 8D:
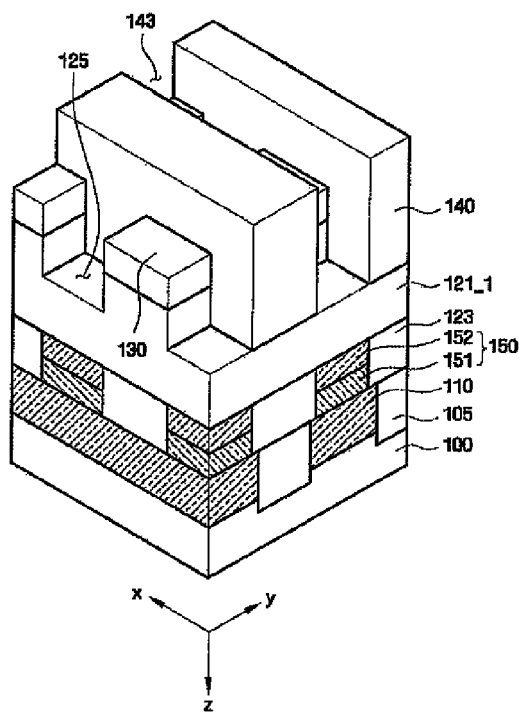
Figure 8E:
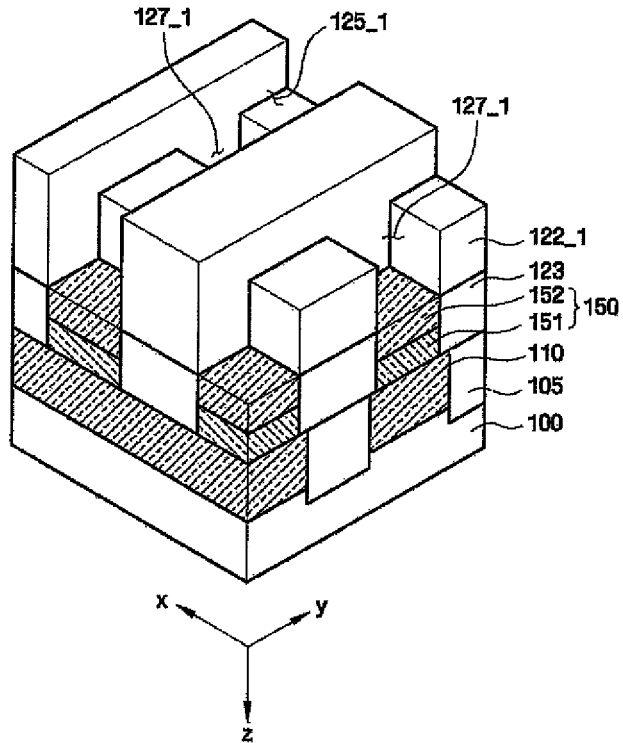

By referring to FIGS. 8A through 8E, a method of fabricating nonvolatile memory device according to another embodiment of the inventive concept is described. FIGS. 8A and 8E are perspective views illustrating structures of process intermediate steps that describe the method of fabricating the nonvolatile memory device according to the embodiment.

Referring to FIGS. 8A through 8E, a method of fabricating a nonvolatile memory device according to another exemplary embodiment of the inventive concept can be practically identical to the method of fabricating a nonvolatile memory device according to the exemplary embodiment of the inventive concept, except that the bottom electrode is not self-aligned with the vertical cell diode 150.

Referring to FIG. 8A, a device isolation region 105 is formed in a first conductive type (e.g., P-type) substrate 100 to define multiple active regions. For example, the multiple active regions extend in the second direction in parallel with each other. In such multiple active regions, second conductive (e.g., N-type) impurities are implanted to form a word line 110.

Next, a first lower dielectric layer pattern 123, where the multiple the first contact holes which expose the word line 110 are formed, is formed on the substrate 100. Then, in the first contact hole, a first semiconductor pattern 151 and the second semiconductor pattern 152 are formed to form the vertical cell diode 150.

Referring to FIG. 8B, a second lower dielectric layer 120_1 and a first sacrificial layer pattern including a first open area 133 which extends in the second direction are formed on the first lower dielectric layer pattern. Specifically, on the first lower dielectric layer 123, the second lower dielectric layer 120_1 and the first sacrificial layer are sequentially formed and a first sacrificial layer pattern 130 can be formed by patterning the first sacrificial layer.

Referring to FIG. 8C, by using the first sacrificial layer pattern 130 a pre-second lower dielectric layer pattern 121_1 including a recess 125_1 which extends in the first direction is formed. Here, the step of forming the pre-second lower dielectric layer pattern 121_1 and the step of forming the first sacrificial layer pattern 130 can be performed by using two different etch processes. However, it is not limited thereto, and in other embodiments of the inventive concept the step of forming the pre-second lower dielectric layer pattern 121_1 and the step of forming the first sacrificial layer pattern 130 may be performed using a single etch process. Thus, by patterning the first sacrificial layer formed on the second lower dielectric layer 120_1 and second lower dielectric layer 120_1 simultaneously, the first sacrificial layer pattern 130 and the pre-second lower dielectric layer pattern 121_1 can be formed.

Referring to FIG. 8D, on the pre-second lower dielectric layer pattern 121_1 and the first sacrificial layer pattern 130 a second sacrificial layer pattern 140 including a second open area 143 which extends in the first direction is formed. Specifically, on the pre-second lower dielectric layer pattern 121_1 and the first sacrificial layer pattern 130 the second sacrificial layer is formed, and by patterning the second sacrificial layer the second sacrificial layer pattern 140 can be completed.

Referring to FIG. 8E, by using the first and second sacrificial layer patterns 130 and 140 a second lower dielectric layer pattern 122_1 including a multiple second contact hole 127_1 which are separately placed in the recess 125_1 is formed. Here, the second contact hole 127_1 has a rectangular shape defined by the intersecting area between the first and the second open areas 133 and 143. In particular, the second contact hole 127_1 has a rectangular shape defined by the width of second contact hole 127_1 that extends in the second direction and is greater than the length of the second contact hole 127_1 that extends in the first direction.

Since the subsequent fabrication processes can be practically the same as those described in relation to FIGS. 4G through 4L, the descriptions of such is omitted.

Figure 9:
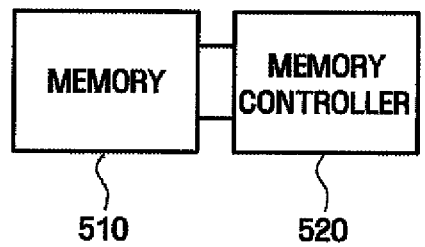
FIGS. 9 through 11 are general block diagrams for systems incorporating a nonvolatile memory device fabricated in accordance with an embodiment of the inventive concept.
Figure 10:
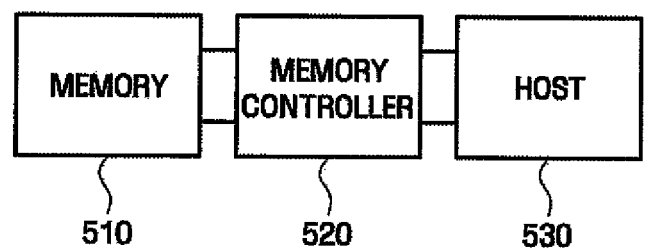
Figure 11:
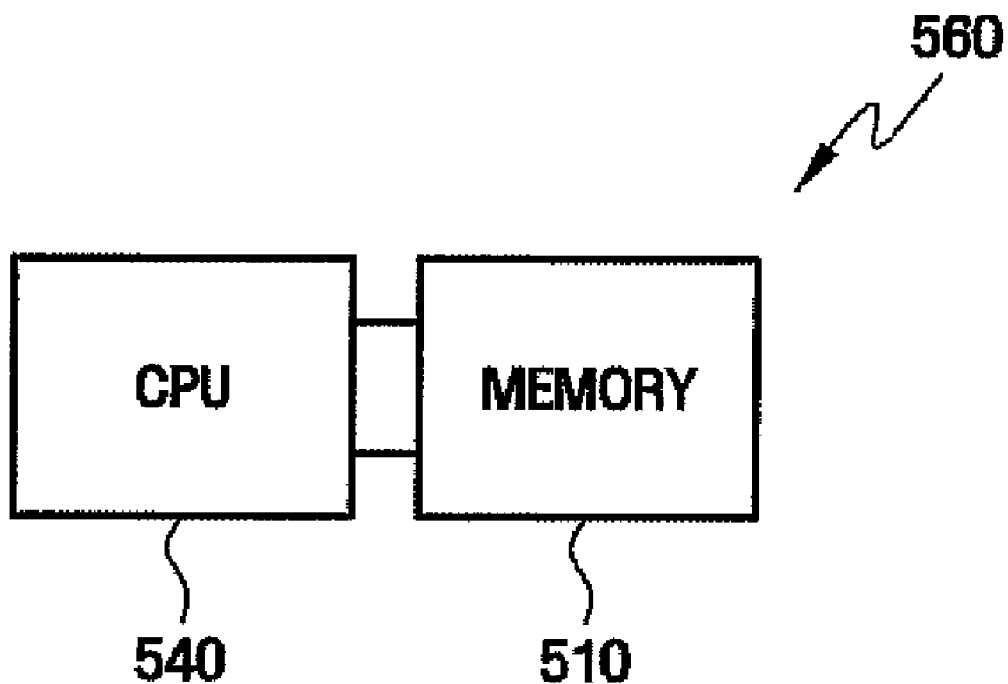

FIGS. 9 through 11 are diagrams illustrating general systems incorporating a nonvolatile memory device fabricated according to an embodiment of the inventive concept.

Referring to FIG. 9, a system comprises a memory 510 and a memory controller 520 connected to the memory 510. Here, the memory 510 may be a nonvolatile memory device fabricated according to the previously described embodiments of the inventive concept, and the memory controller 520 can provide input signals which controls operations of the memory 510. For example, the memory controller 520 can provide the memory 510 with command signals which controls read operation and write operation and address signals.

A system containing such memory 510 and the memory controller 520 can be embodied into a card such as memory card. Specifically, the system according to embodiments of the inventive concept can be embodied into an industry standard card used in electronics devices including cellular phones, two-way communication systems, one way pagers, two-way pagers, personal communication systems, portable computers, PDAs: Personal Data Assistances, audio and/or video players, digital and/or video cameras, navigation systems, and Global Positioning Systems. However, it is not limited thereto, and the system according to the exemplary embodiment of the inventive concept can be embodied into various devices including memory sticks.

Referring to FIG. 10, another system comprises a memory 510, a memory controller 520, and a host system 530. Here, the host system 530 is connected to the memory controller 520 through a bus and provides the memory controller 520 with a control signal to allow the memory controller 520 to control operations of the memory 510. Such host system 530 can be a processing system used in cellular phones, two-way communication systems, one way pagers, two-way pagers, personal communication systems, portable computers, PDAs: Personal Data Assistants, audio and/or video players, digital and/or video cameras, navigation systems, and Global Positioning Systems.

Also, in FIG. 10 although the memory controller 520 is placed in between the memory 510 and the host system 530, it is not limited thereto. In other embodiments of the inventive concept, the memory controller 520 may be completely omitted.

Referring to FIG. 11, yet another system comprises a computer system 560 including a Central Processing Unit (CPU) 540 and a memory 510. In the computer system 560, the memory 510 may be directly connected to the CPU 540 or connected through typical computer bus architecture and can store an Operating System (OS) instruction set, a Basic Input/Output Start up (BIOS) instruction set, and an Advanced Configuration and Power Interface (ACPI) instruction set. Also, the memory 510 may be used as a mass storage device such as a Solid State Disk (SSD).

While the inventive concept has been particularly shown and described with reference to embodiments thereof, it will be understood by those of ordinary skill in the art that various changes in form and details may be made therein without departing from the scope of the inventive concept as defined by the following claims. It is therefore desired that the embodiments be considered in all respects as illustrative and not restrictive, reference being made to the appended claims rather than the foregoing description to indicate the scope of the inventive concept.

What is claimed is:

1. A method of fabricating a nonvolatile memory device, the method comprising:
    forming a lower dielectric layer on a word line;
    forming a first sacrificial layer pattern on the lower dielectric layer, the first sacrificial layer pattern including a first open area having a first width and separating adjacent first sacrificial layer pattern elements that extend in a first direction on the lower dielectric layer;
    forming a pre-lower dielectric layer pattern from the lower dielectric layer by partially etching portions the lower dielectric layer exposed in the first open area using the first sacrificial layer pattern as an etching mask, the first open area being deepened into a recess having the first width and separating adjacent pre-lower dielectric layer pattern elements;
    forming a second sacrificial layer pattern on the pre-lower dielectric layer pattern and overlapping the first sacrificial layer pattern, the second sacrificial layer pattern including a second open area having a second width and separating adjacent second sacrificial layer pattern elements that extend in a second direction on the pre-lower dielectric layer pattern, wherein the second open area intersects the recess;
    forming a lower dielectric layer pattern from the pre-lower dielectric layer pattern by completely etching portions of the pre-lower dielectric layer pattern exposed in the intersection between the second open area and the recess to form a contact hole through the lower dielectric layer pattern exposing an upper surface of the word line;
    before forming a bottom electrode in the contact hole, forming a vertical cell diode in the contact hole, such that a lower surface of the bottom electrode is formed in electrical contact with the vertical cell diode; and
    forming the bottom electrode in the contact hole by
        conformally forming a conductive layer within the contact hole on an upper surface of the vertical cell diode and on exposed sidewall surfaces of the contact hole above the vertical cell diode, such that the bottom electrode has a substantially rectangular open-box structure including an open center portion defined by the lower surface being connected to opposing first and third sidewalls and opposing second and fourth sidewalls formed on the exposed sidewall surfaces of the contact hole above the vertical cell diode,
        forming a first inner dielectric layer to fill the open center portion of the bottom electrode, and
        removing at least a majority portion of the first sidewall, a portion of the second sidewall, and a portion of the fourth sidewall of the bottom electrode.

2. The method of claim 1, further comprising:
    forming a variable resistor pattern in the recess on the exposed upper edge surface of the bottom electrode, such that the variable resistor pattern is electrically connected to an exposed upper edge surface of the bottom electrode.

3. The method of claim 2, further comprising:
    before forming the variable resistor pattern, forming a spacer on on a sidewall of the recess to partially cover the exposed upper edge surface of the bottom electrode, wherein the variable resistor pattern is formed on the spacer.

4. The method of claim 1, further comprising:
    forming a second inner dielectric layer to replace the removed at least majority portion of the first sidewall, the removed portion of the second sidewall, and the removed portion of the fourth sidewall of the bottom electrode.

5. The method of claim 1, wherein
    removing at least the majority portion of the first sidewall comprises completely removing the entire first sidewall of the bottom electrode down to the lower surface of the bottom electrode;
    removing the portion of the second sidewall comprises completely removing the portion of the second sidewall down to the lower surface of the bottom electrode; and
    removing the portion of the fourth sidewall comprises completely removing the portion of the fourth sidewall down to the lower surface of the bottom electrode.

6. The method of claim 1, further comprising:
    forming a bit line that extends in the first direction on the lower dielectric layer pattern.

7. The method of claim 1, wherein the second width is less than the first width.

8. The method of claim 2, wherein the variable resistor pattern is formed from a phase change material.

9. A method of fabricating a nonvolatile memory device, the method comprising:
    forming a lower dielectric layer on a word line;
    forming a first sacrificial layer pattern on the lower dielectric layer, the first sacrificial layer pattern including a first open area having a first width and separating adjacent first sacrificial layer pattern elements that extend in a first direction on the lower dielectric layer;
    forming a pre-lower dielectric layer pattern from the lower dielectric layer by partially etching portions the lower dielectric layer exposed in the first open area using the first sacrificial layer pattern as an etching mask, the first open area being deepened into a recess having the first width and separating adjacent pre-lower dielectric layer pattern elements;

forming a second sacrificial layer pattern on the pre-lower dielectric layer pattern and overlapping the first sacrificial layer pattern, the second sacrificial layer pattern including a second open area having a second width and separating adjacent second sacrificial layer pattern elements that extend in a second direction on the pre-lower dielectric layer pattern, wherein the second open area intersects the recess;

forming a lower dielectric layer pattern from the pre-lower dielectric layer pattern by completely etching portions of the pre-lower dielectric layer pattern exposed in the intersection between the second open area and the recess to form a contact hole through the lower dielectric layer pattern exposing an upper surface of the word line;

forming a bottom electrode in the contact hole by conformally forming a conductive layer within the contact hole on an upper surface of the vertical cell diode and on exposed sidewall surfaces of the contact hole above the vertical cell diode, such that the bottom electrode has a substantially rectangular open-box structure including an open center portion filled with an inner dielectric layer and defined by the lower surface being connected to opposing first and third sidewalls and opposing second and fourth sidewalls formed on the exposed sidewall surfaces of the contact hole above the vertical diode, wherein an upper edge surface of at least one of the first, second, third and fourth sidewalls forms an exposed upper edge surface of the bottom electrode;

forming an outer dielectric layer to partially cover the exposed upper edge surface of the bottom electrode; and forming a variable resistor pattern in the recess on an the exposed upper edge surface of the bottom electrode, such that the variable resistor pattern is electrically connected to the exposed upper edge surface of the bottom electrode.

* * * * *